United States Patent
Burton et al.

(10) Patent No.: US 6,168,696 B1
(45) Date of Patent: Jan. 2, 2001

(54) NON-KNURLED INDUCTION COIL FOR IONIZED METAL DEPOSITION, SPUTTERING APPARATUS INCLUDING SAME, AND METHOD OF CONSTRUCTING THE APPARATUS

(75) Inventors: Randle D. Burton; Scott G. Meikle; James A. Schindel, all of Boise, ID (US)

(73) Assignee: Micron Technology, Inc., Boise, ID (US)

( * ) Notice: Under 35 U.S.C. 154(b), the term of this patent shall be extended for 0 days.

(21) Appl. No.: 09/388,246

(22) Filed: Sep. 1, 1999

(51) Int. Cl.[7] ............................. C23C 14/34; C23C 14/42; C23C 14/44; C23C 14/56; H01F 27/28

(52) U.S. Cl. .................. 204/298.06; 204/298.02; 204/298.08; 204/298.12; 204/298.15; 336/15; 336/170; 336/177; 336/180; 336/182; 336/188; 336/211; 336/220; 336/223; 336/225; 336/229; 323/355

(58) Field of Search ................ 204/298.02, 298.06, 204/298.08, 298.12, 298.15; 336/15, 170, 177, 180, 182, 188, 211, 220, 223, 225, 229; 323/355

(56) References Cited

U.S. PATENT DOCUMENTS

| | | |
|---|---|---|
| 4,990,229 | 2/1991 | Campbell et al. . |
| 4,999,096 | 3/1991 | Nihei et al. . |
| 5,032,568 | 7/1991 | Lau et al. . |
| 5,122,251 | 6/1992 | Campbell et al. . |
| 5,178,739 * | 1/1993 | Barnes et al. .................... 204/192.12 |
| 5,202,008 | 4/1993 | Talieh et al. . |
| 5,280,154 | 1/1994 | Cuomo et al. . |
| 5,380,414 | 1/1995 | Tepman . |
| 5,382,339 | 1/1995 | Aranovich . |
| 5,391,275 | 2/1995 | Mintz . |
| 5,401,350 | 3/1995 | Patrick et al. . |
| 5,409,587 | 4/1995 | Sandhu et al. . |
| 5,431,799 | 7/1995 | Mosely et al. . |
| 5,518,593 | 5/1996 | Hosokawa et al. . |
| 5,550,102 | 8/1996 | Nakai et al. . |
| 5,556,521 | 9/1996 | Ghanbari . |
| 5,578,165 | 11/1996 | Patrick et al. . |
| 5,677,597 | 10/1997 | Tanaka . |
| 5,707,498 | 1/1998 | Ngan . |
| 5,762,748 | 6/1998 | Banholzer et al. . |
| 5,763,851 | 6/1998 | Forster et al. . |
| 5,961,793 * | 10/1999 | Ngan ............................... 204/192.12 |

FOREIGN PATENT DOCUMENTS 4-46604 * 2/1992 (JP) .

* cited by examiner

*Primary Examiner*—Alan Diamond
(74) *Attorney, Agent, or Firm*—Trask Britt

(57) ABSTRACT

An RF induction coil for inductively coupled ionized sputtering applications having at least one extremely smooth surface, on the order of about 30 $\mu$m or less, which faces, substantially resides within, or is immediately proximate a plasma field in a sputtering chamber. The smooth induction coil requires only an extremely short burn-in time to remove surface damage and contaminants until a steady-state sputtering rate is achieved. The smooth induction coil may be constructed of target material, or a material distinct from the target material, and can be of any suitable geometry or configuration.

30 Claims, 7 Drawing Sheets

NON-KNURLED INDUCTION COIL FOR IONIZED METAL DEPOSITION, SPUTTERING APPARATUS INCLUDING SAME, AND METHOD OF CONSTRUCTING THE APPARATUS

BACKGROUND OF THE INVENTION

1. Field of the Invention

The present invention relates generally to ionized physical vapor deposition (PVD), and, more specifically, to an ionized PVD apparatus in which the ionization energy is provided by an RF induction coil located inside the processing chamber. In particular, the invention relates to an improved RF induction coil design that reduces processing time and cost.

2. State of the Art

Ionized physical vapor deposition, also known as ionized sputtering, is a process used to deposit thin material films onto a substrate, or workpiece, and is well known in the art. Ionized sputtering processes are commonly employed in the semiconductor industry to deposit thin material films, typically conductive materials, such as, for example, metals, onto the surface of a semiconductor wafer or other such substrates.

Inductively coupled ionized sputtering refers to a specific ionized PVD process in which the ionization energy is provided, as illustrated in FIG. 4, by an induction coil 204 located inside a deposition chamber 202 adjacent a target 206 (material to be deposited) and workpiece 208 (object to receive deposited material) which is supported on a pedestal 212. The pedestal 212 is selectively connectable to an RF or DC power bias 214 and the target 206 is selectively connectable to an RF or DC power source 216.

A sputtering gas (not shown), such as argon, is introduced into the deposition chamber 202. A negative DC voltage, relative to the electrically grounded walls 218 of the deposition chamber 202, is applied to the target 206 with the DC power source 216 to excite the sputtering gas near the target 206 into a plasma state to form a plasma field. The negative voltage then accelerates sputtering gas ions 228 within the plasma field toward the target 206. Upon impacting the target 206, the sputtering gas ions 228 dislodge atoms of the target 206, resulting in an emission, or sputtering, of target atoms 226 away from the surface of the target 206. The sputtered target atoms 226 travel away from the target at varying angles, resulting in a wide distribution of trajectories.

An RF power source 232 energizes the induction coil 204, exciting a relatively high density plasma region 224 in a region between the target 206 and the workpiece 208. Target atoms 226 traveling into the high density plasma region 224 are ionized to form ionized target atoms 236. A negative DC voltage is also applied to the workpiece 208 relative to the electrically grounded walls 218 of the deposition chamber 202. The negative voltage of the workpiece 208, relative to the high density plasma region 224, accelerates the ionized sputtered target atoms 236 toward the workpiece 208. The path of each ionized target atom 236 from the high density plasma region 224 and toward the workpiece 208 is substantially perpendicular to an exposed surface 238 of the workpiece 208. Thus, the wide trajectory distribution of target atoms 226 sputtered off the target 206 is essentially focused into a much narrower band of substantially perpendicular trajectories toward the exposed surface 238. A distribution of ionized target atoms 236 incident on the workpiece 208 that is generally perpendicular to their trajectories facilitates the filling of cavities on the exposed surface 238 of the workpiece 208 that have a high depth to width ratio (aspect ratio). Such a distribution of perpendicularly-focused target atoms 226 is especially useful in the semiconductor industry for producing high aspect ratio features on the surface of a workpiece in the form of a semiconductor wafer or other substrate of semiconductor material.

Induction coils 204 for inductively coupled ionized sputtering processes are well known in the art and have been designed in a variety of configurations. U.S. Pat. No. 5,122,251, issued Jun. 16, 1992 to Campbell et al., discloses a single loop induction coil (see FIG. 5); U.S. Pat. No. 4,999,096, issued Mar. 12, 1991 to Nihei et al., shows a multiple loop induction coil (see FIG. 6); U.S. Pat. No. 5,280,154, issued Jan. 18, 1994 to Cuomo et al., discloses various multiple loop, shaped induction coils with generally flattened surfaces formed by parallel conductors; U.S. Pat. No. 5,401,350, issued Mar. 28, 1995 to Patrick et al., and U.S. Pat. No. 5,578,165, issued Nov. 26, 1996 to Patrick et al., disclose various multiple loop induction coil configurations including a spiral induction coil (see FIG. 7), a variable pitch spiral induction coil (see FIG. 8), and an S-shaped induction coil (see FIG. 9); and U.S. Pat. No. 4,990,229, issued Feb. 5, 1991 to Campbell et al., discloses various multiple loop, shaped induction coil configurations.

One problem which occurs with the inductively coupled ionized sputtering process is the potential contamination of the workpiece and chamber with induction coil material. During the inductively coupled ionized sputtering process, the RF power applied to the induction coil usually produces negative instantaneous voltages along the induction coil. When any point on the induction coil is subjected to a negative instantaneous voltage, that portion of the induction coil will be bombarded by sputtering gas ions, causing induction coil material to be sputtered away from the induction coil surface. The sputtered induction coil atoms may deposit on the workpiece (such as a semiconductor wafer), resulting in contamination of the deposited material or film.

Various solutions have been proposed to solve this form of contamination. For example, U.S. Pat. No. 5,707,498, issued Jan. 13, 1998 to Ngan ("the Ngan patent"), hereby incorporated herein by reference, discloses a method in which the induction coil is pasted, or pre-coated, with target material prior to initiating the sputtering process on an actual workpiece. However, depending on the target material and film thickness, such material deposited onto the induction coil surface may subsequently flake off the induction coil. Flaking or peeling of such material results when the contraction of newly applied material (upon cooling) is restrained by the adhesion between the newly sputtered film and the surface upon which it is deposited. Flaking of material sputter deposited onto the induction coil or other hardware located within the vacuum chamber is a problem well known in the art and a discussion of the causes of flaking is found in U.S. Pat. No. 5,518,593, issued May 21, 1996 to Hosokawa et al., hereby incorporated herein by reference.

The Ngan patent suggests that the surface of the induction coil be roughened to enhance the adhesion of sputtered target material onto the induction coil surface. A rough induction coil surface reduces peeling by breaking up the newly sputtered film into small sections, which are less susceptible to flaking due to the stress relief occurring at section breaks, and by providing increased surface area on which the sputtered material can adhere. The roughened induction coil surface can be introduced in any number of ways including bead blasting (as suggested in the Ngan patent) or machine knurling.

Using a roughened surface to increase adhesion and prevent flaking is not limited to an induction coil. U.S. Pat. No. 5,762,748, issued Jun. 9, 1998 to Banholzer et al., discloses a lid and door for a vacuum chamber that are bead blasted to enhance their adhesion properties. Similarly, both U.S. Pat. No. 5,391,275, issued Feb. 21, 1995 to Mintz, and U.S. Pat. No. 5,202,008, issued Apr. 13, 1993 to Talieh et al., disclose a vacuum chamber shield that is pretreated with bead blasting in order to facilitate adhesion of sputtering material.

An alternative to pre-coating the induction coil with sputtering material is discussed in U.S. Pat. No. 5,178,739, issued Jan. 12, 1993 to Barnes et al. ("the Barnes patent"). To prevent contamination, the Barnes patent suggests fabricating the induction coil from material identical to that of the target. Atoms of induction coil material, sputtered onto the workpiece surface will then be identical to the target material thus reducing contamination of the workpiece by induction coil material. However, constructing the induction coil of target material does not overcome a second contamination mode that exists in inductively coupled ionized sputtering applications. Sputtered atoms originating from the target may be deposited onto the induction coil and flake off the induction coil surface, even if the flakes are material identical to the material being sputtered, which flaking can contaminate or disturb the continuity of a thin film being deposited on the workpiece. To prevent this mode of contamination, induction coils fabricated from target material also conventionally have roughened surfaces to promote adhesion of any target material deposited onto the induction coil.

All induction coils used in inductively coupled ionized sputtering applications must be subjected to a procedure referred to as "burn-in". Prior to performing a sputtering operation, surface damage and surface contaminants lodged on the surface of the induction coil introduced during manufacturing of the induction coil must be removed. The surface contamination and damage are removed during burn-in by subjecting the induction coil to normal process parameters for a sufficient duration of time, as known in the art. Non-production workpiece materials may be used during burn-in. Generally, the rate of sputter deposition onto the workpiece is initially high, due to an increase in material sputtering off the induction coil surface resulting from surface damage and contaminants. The rate of sputter deposition eventually levels off to a steady-state sputtering rate. The duration of time necessary to reach a steady-state sputtering rate onto the workpiece with the new induction coil is known as the "burn-in time". As a practical matter, burn-in is achieved after the sheet resistance, which is a measurement indicative of the thickness and other characteristics of the film deposited on the workpiece, and non-uniformity, which is based on measurements of sheet resistance at multiple points across the surface of the workpiece, reach steady-state values.

Present induction coil designs require lengthy burn-in time before the induction coil is conditioned for steady-state sputtering on an actual workpiece. In a production setting, such as in the production of semiconductor dice from a wafer, a lengthy burn-in time greatly increases the unit cost of production due to the idling of deposition chambers while burn-in of a new induction coil is effected and deposition of excessive material on surfaces within the chamber as burn-in is conducted. Thus, a need exists in inductively coupled ionized sputtering applications for a new induction coil design that requires a shorter burn-in time and which does not introduce increased workpiece contamination as a result of flaking or other contamination modes.

SUMMARY OF THE INVENTION

The present invention relates to an induction coil design for inductively coupled ionized sputtering applications that significantly reduces required burn-in time. The induction coil of the present invention has at least one extremely smooth surface. Surface roughness introduced, as in conventional induction coil designs to the surface of an induction coil through machine knurling, bead blasting, or other processes is not necessary and is, in fact, in opposition to the present invention. The present invention is applicable to all induction coil designs, independent of a particular induction coil geometry, including single loop, multiple loop, or shaped induction coil configurations.

As noted above, during burn-in, surface contamination and damage are removed from the surface of the induction coil. Induction coils with a roughened surface exhibit a high level of surface contamination and damage resulting from the post-fabrication machining processes required to introduce the irregular surface profile. In comparison, the level of surface contamination and damage on induction coils formed with a smooth surface, according to the invention, is relatively low in comparison. The sputtering rate off a heavily damaged induction coil surface, such as a bead-blasted or machine knurled surface, is high when the induction coil is first used and then levels off to a steady-state value. When the steady-state sputtering rate is achieved, burn-in is complete and the induction coil can be used to process an actual workpiece. Reducing the level of surface contamination and damage results in a corresponding decrease in time required to effect a burn-in. Smooth-surfaced induction coils exhibiting relatively little surface damage achieve a steady-state sputtering rate in significantly less time.

Reductions in burn-in time of, and exceeding, eighty percent have, surprisingly, been achieved for smooth induction coils, as compared to machine-knurled induction coils. An induction coil having a surface roughness in the range of less than 2 $\mu$m to about 30 $\mu$m Ra has been shown to achieve a significant degree of reduction in burn-in time with no observable increase in workpiece contamination. The most significant advantage of this reduced burn-in time is a corresponding decrease in the unit cost of production or, in semiconductor manufacturing, the cost per wafer. A secondary, but still notable, advantage is a reduction in induction coil fabrication costs. However, this cost saving is dependent upon the quality of surface finish and type of material that are specified for a particular induction coil.

BRIEF DESCRIPTION OF THE DRAWINGS

While the specification concludes with claims particularly pointing out and distinctly claiming that which is regarded as the present invention, the advantages of this invention can be more readily ascertained from the following description of the invention when read in conjunction with the accompanying drawings in which:

DETAILED DESCRIPTION OF THE PREFERRED EMBODIMENTS

Figure 1:
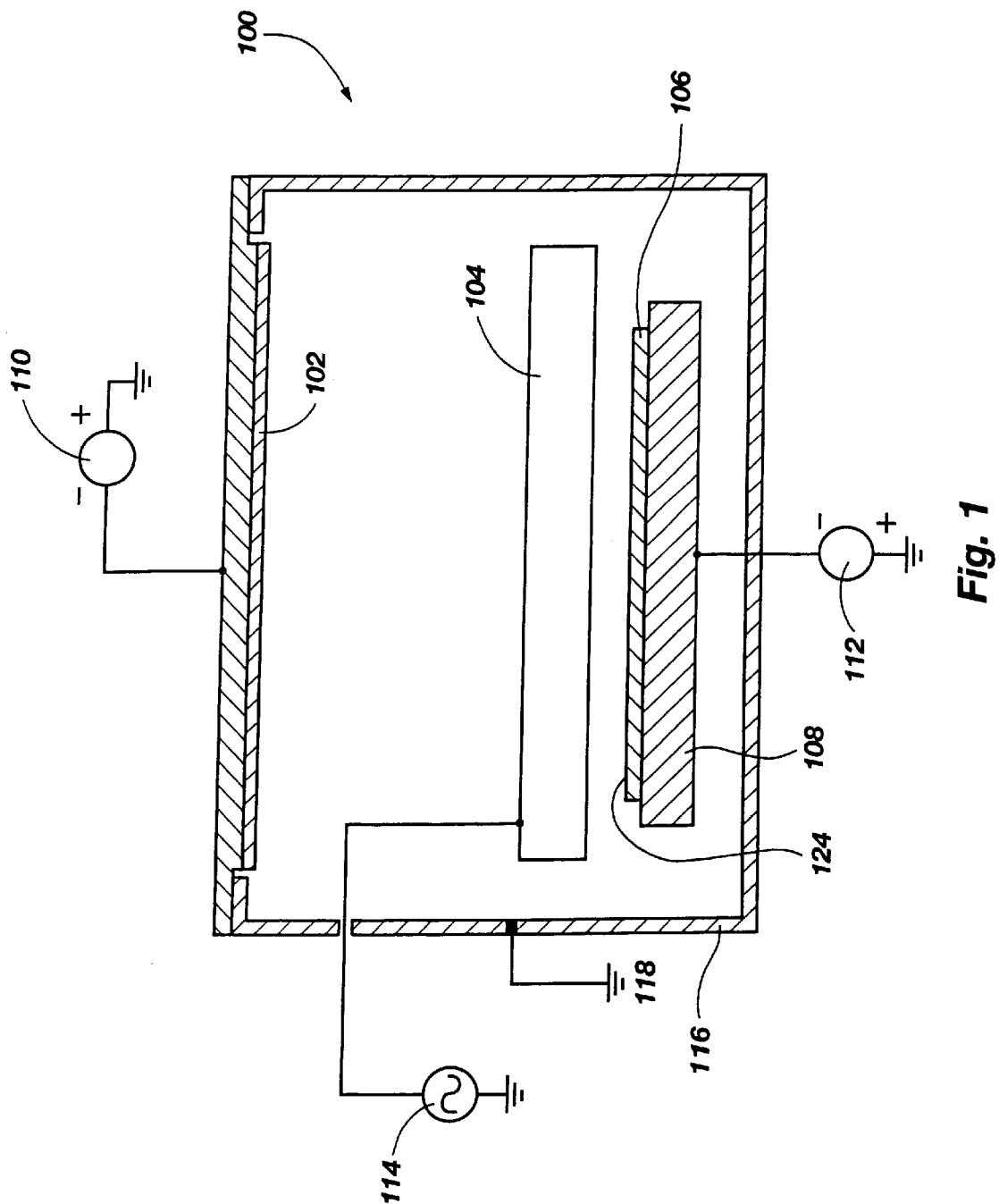
FIG. 1 is a schematic of an inductively coupled ionized sputtering apparatus incorporating a non-knurled or smooth RF induction coil according to the present invention.
Figure 3:
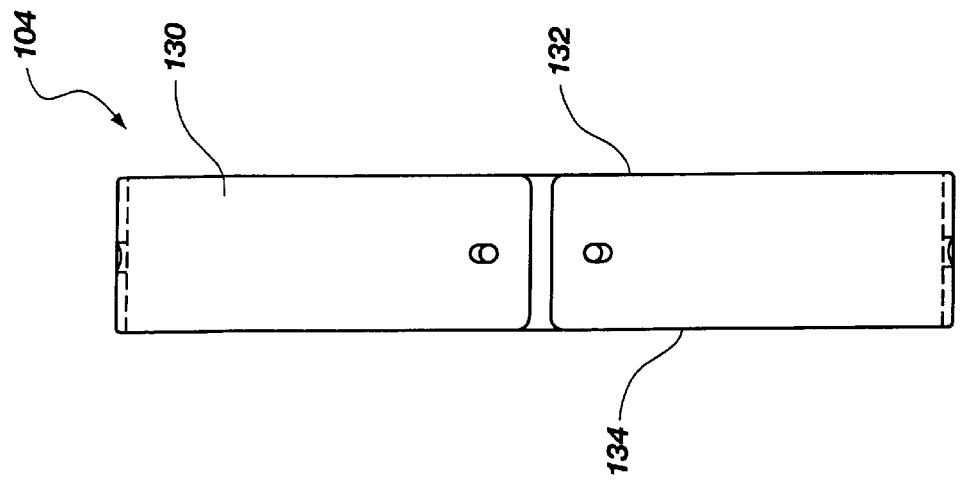
FIG. 3 is a side view of the RF induction coil of FIG. 1 according to the present invention.
Figure 2:
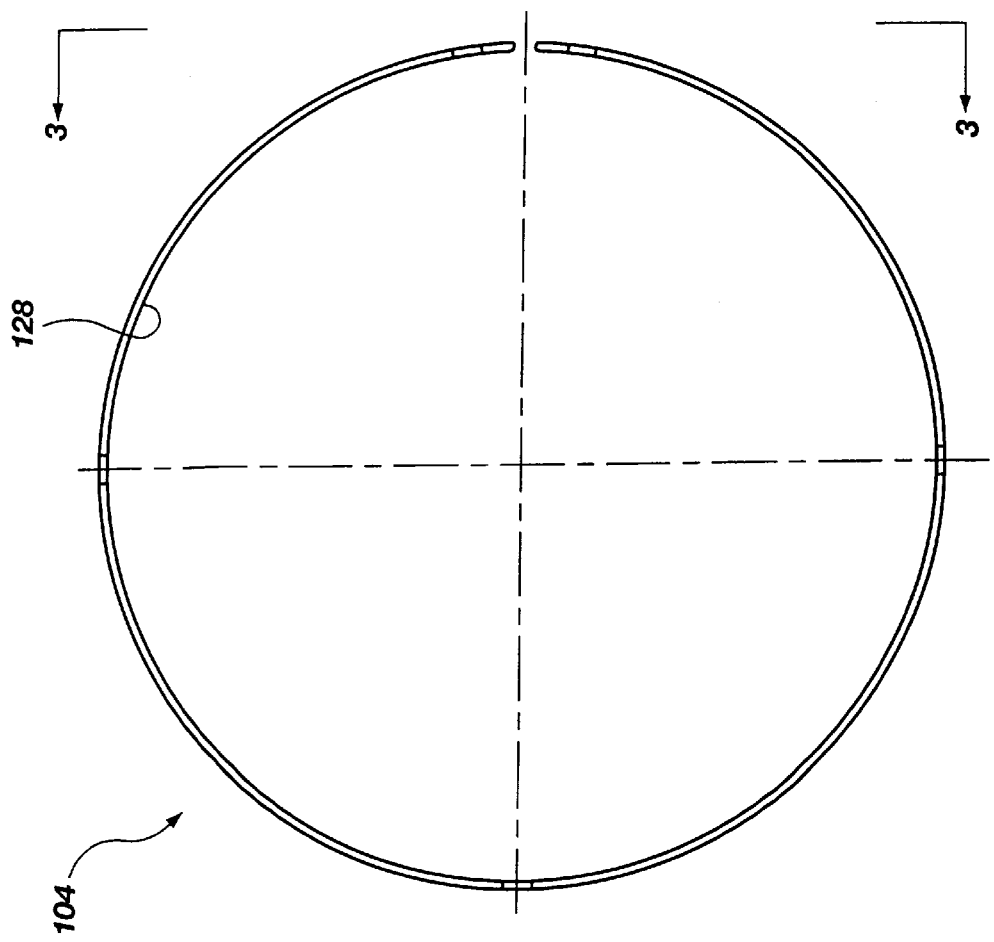
FIG. 2 is a plan view of the RF induction coil of FIG. 1 according to the present invention.
Figure 4:
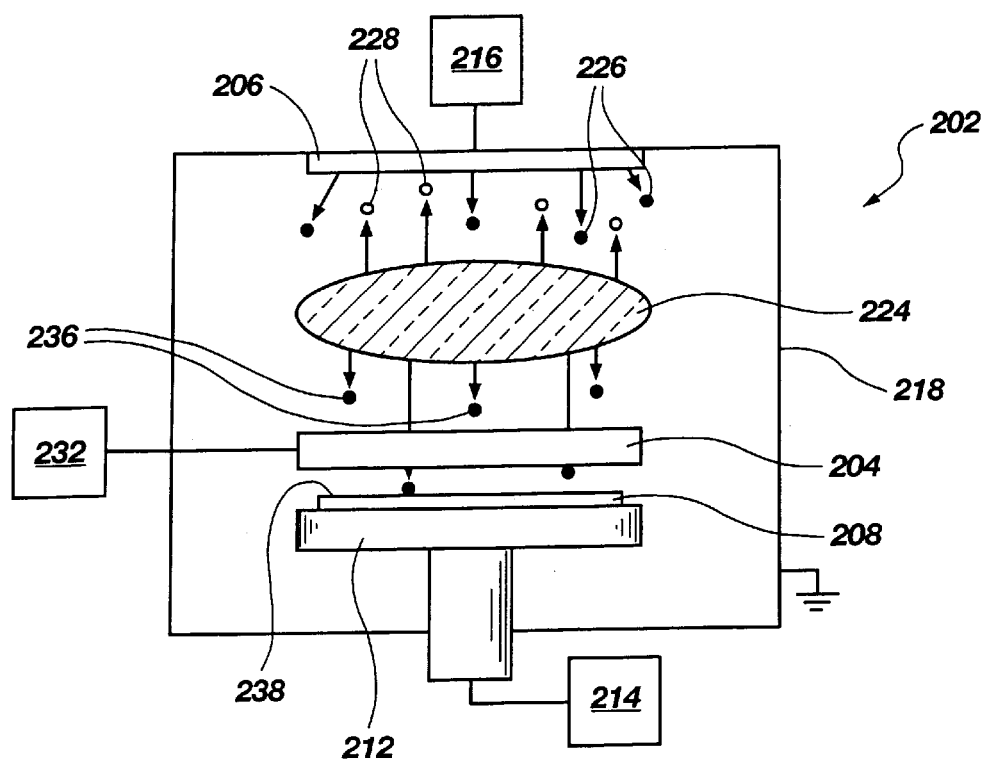
FIG. 4 is a schematic of a prior art inductively coupled ionized sputtering apparatus.
Figure 5:
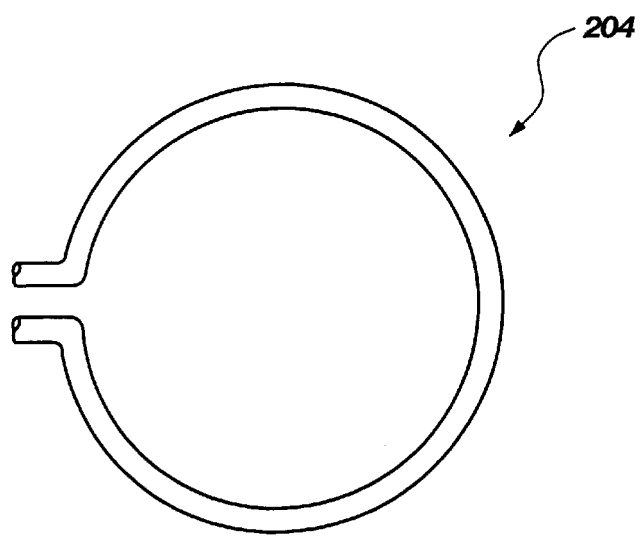
FIGS. 5–9 are various views of prior art induction coil configurations.
Figure 6:
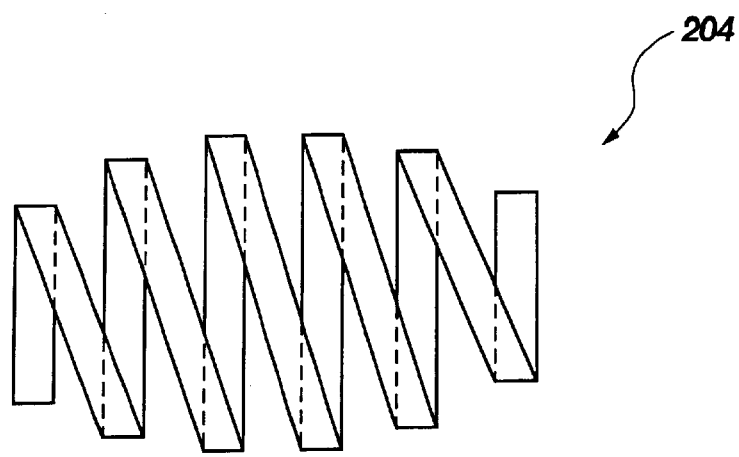
Figure 7:
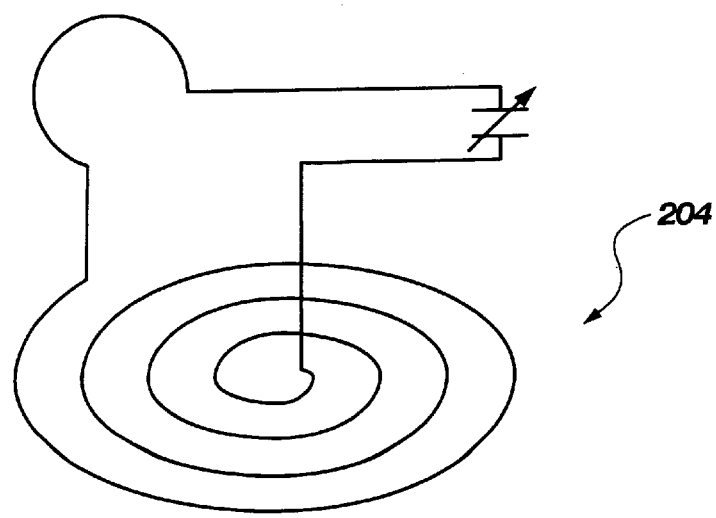
Figure 8:
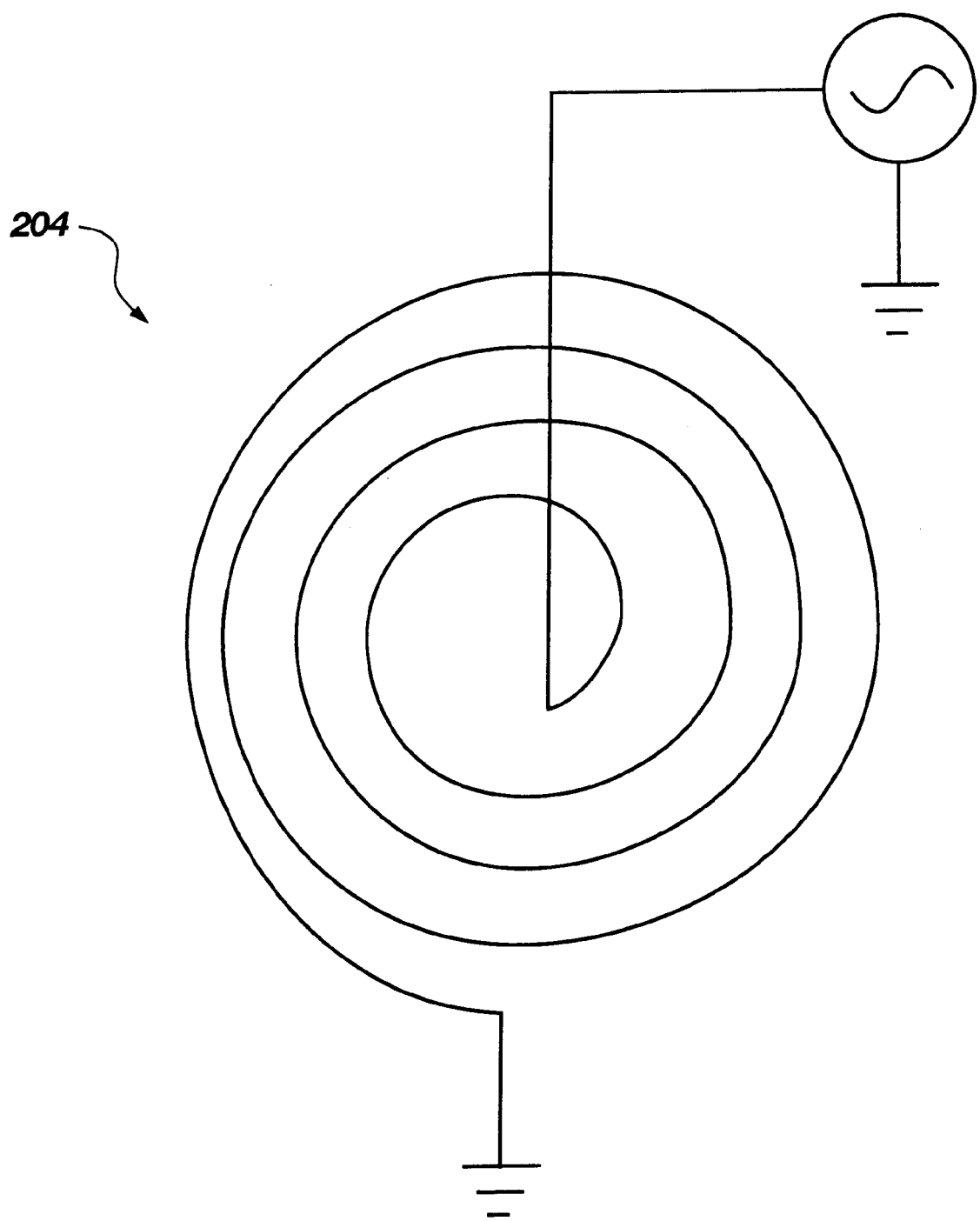
Figure 9:
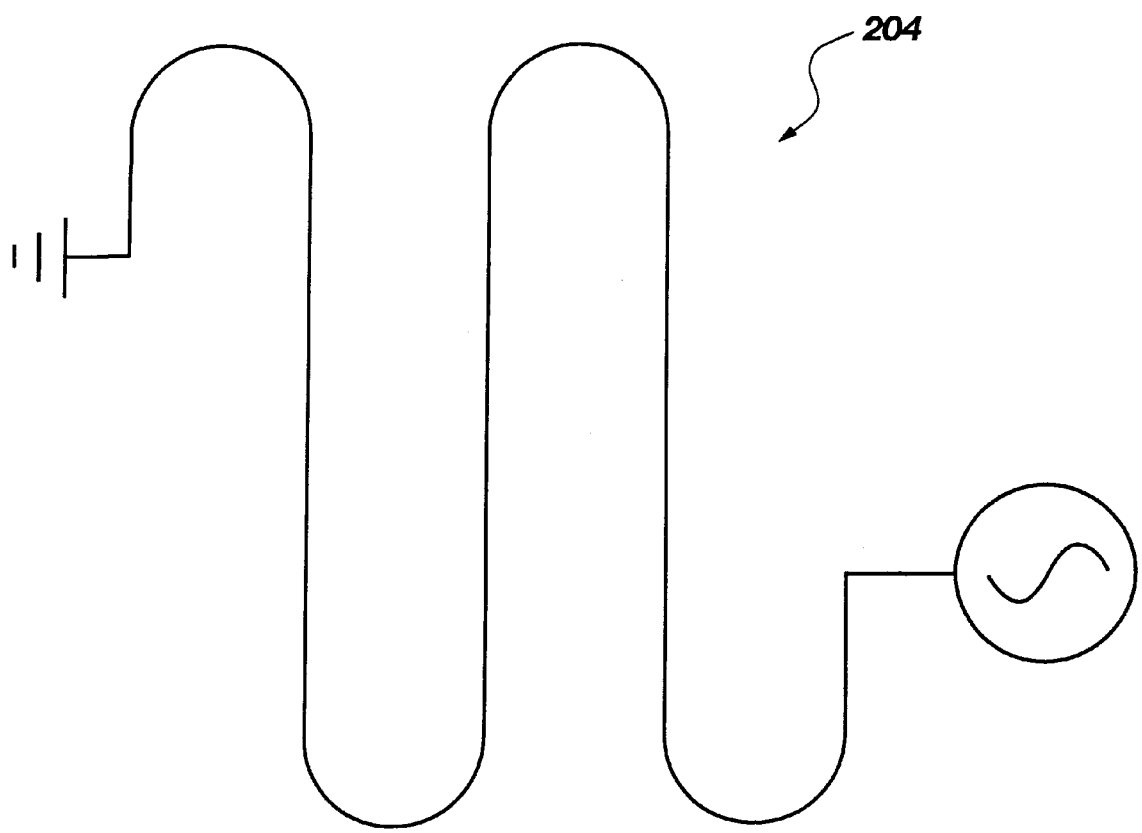

FIGS. 1–3 illustrate structures used in inductively coupled ionized sputtering according to the present invention. It should be understood that the illustrations are not meant to be actual views of any particular device used in inductively coupled ionized sputtering, but are merely idealized representations which are employed to more clearly and fully depict the present invention than would otherwise be possible.

FIG. 1 shows an exemplary inductively coupled ionized sputtering chamber 100, housing a target 102, a non-knurled or smooth induction coil 104, and a workpiece 106, wherein the workpiece 106 is mounted on a workpiece pedestal 108. A first DC power supply 110 is in selective electrical contact with the target 102 and a second DC power supply 112 is in selective electrical contact with the workpiece 106. Power is selectively applied to the smooth induction coil 104 from an RF power supply 114. At least one wall 116 of the chamber 100 is connected to electrical ground 118.

During a sputtering operation, a sputtering gas, such as argon (not shown), is introduced into the chamber 100 and a negative DC voltage is supplied by the first DC power supply 110 to the target 102, which excites the sputtering gas near the target 102 into a plasma state. Sputtering gas ions within the plasma are accelerated towards the negative biased (relative to the grounded chamber wall 116) target and the resulting impact with the target 102 dislodges atoms of target material. The dislodged target atoms are sputtered away from the target 102 at a wide angular distribution. The RF power source 114 supplies RF energy to the smooth induction coil 104, forming a region or field of high density plasma (not shown) between the target 102 and the workpiece 106. Target atoms sputtered away from target 102 enter the high density plasma formed by the smooth induction coil 104 and are ionized. The second DC power source 112 applies a negative DC bias voltage (relative to the electrically grounded chamber wall 116) to the workpiece 106, accelerating ionized sputtered target atoms toward the workpiece 106 in paths that are generally perpendicular to an exposed surface 124 of the workpiece 106, so that the ionized sputtered target atoms impinge onto the exposed workpiece surface 124 and penetrate into any cavities or other features recessed therein, such as vias and trenches.

Figure 10:
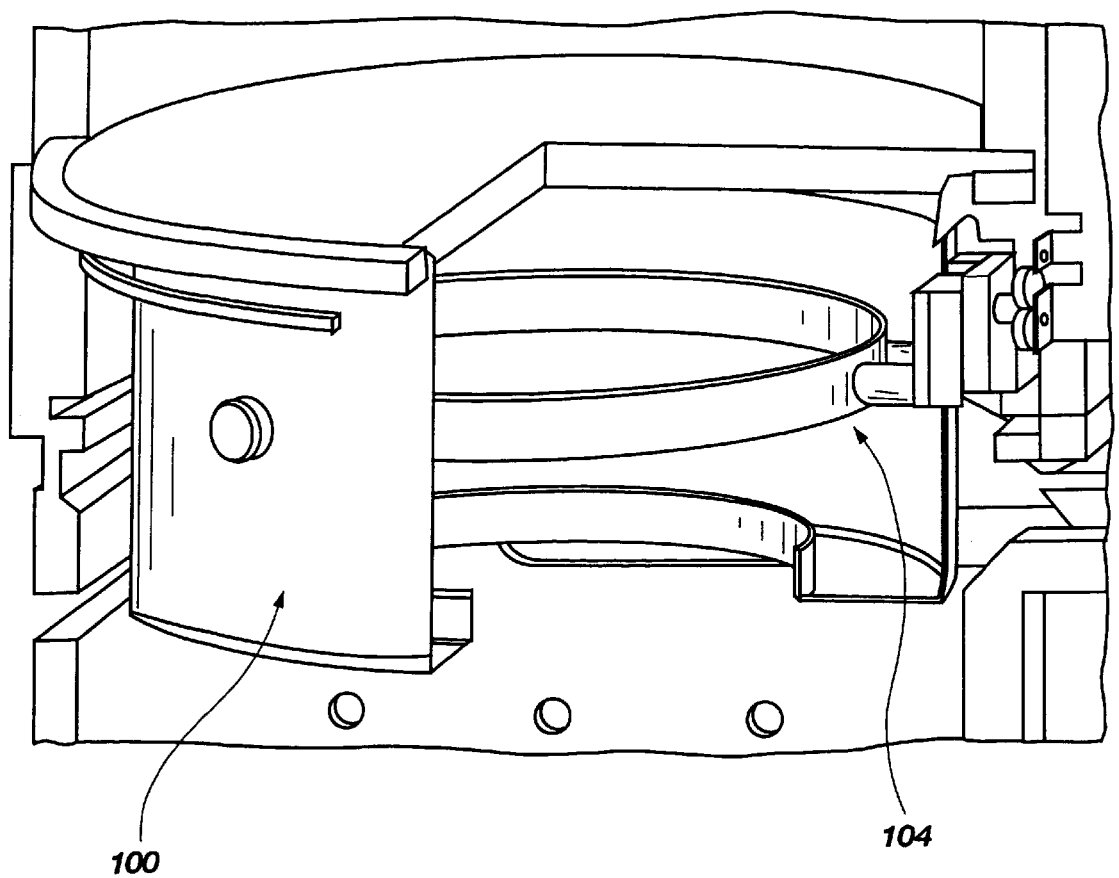
FIG. 10 is a partial sectional perspective view of an induction coil according to the invention, disposed in a sputtering chamber.

FIG. 2 shows a plan view of a smooth induction coil 104 of the present invention having a generally annular shape, while FIG. 3 shows a side view of the smooth induction coil 104. In the preferred embodiment of the present invention, the smooth induction coil 104 has at least a smooth, or non-knurled, interior surface 128, and preferably a smooth exterior surface 130 and upper and lower edges 132 and 134. Smooth induction coil 104 may be constructed of target material or a material that is different than that of the target 102. Prior to being used to sputter deposit target atoms onto a workpiece surface, the smooth induction coil 104 must be subjected to a burn-in process. To achieve burn-in, the smooth induction coil 104 is subjected to normal process parameters, as known in the art, in order to remove or sputter away surface contaminants and damage introduced to the induction coil surfaces 128, 130, and 132, edges 134 during fabrication. Burn-in of the smooth induction coil 104 is complete when the rate of sputter deposition onto the workpiece 106 reaches a substantially steady-state level. FIG. 10 is a partial sectional perspective view of a sputtering chamber 100 of an Applied Materials Vectra™ System for IMP (ion metal plasma)-enhanced PVD having an induction coil 104 of the present invention installed therein.

The time required to burn-in an induction coil has been demonstrated to be somewhat proportional to the induction coil surface roughness and, because standard induction coils have knurled or roughened surfaces, relatively long periods in terms of kilowatt hours (KwH) are normally required to achieve burn-in. The smooth induction coil 104 of the present invention reduces the required burn-in time by substantially eliminating any machine knurling from the induction coil surfaces 128, 130 and edges 132, 134 and by minimizing surface roughness generally. To achieve a reduction in burn-in time, the preferred embodiment of the smooth induction coil 104 preferably has at least an interior surface 128 and, more preferably, upper and lower edges 132 and 134 as well, exhibiting an average surface roughness of no more than about 30 μm and, preferably, between about 2 μm and 30 μm Ra. It is believed that an average surface roughness less than about 2 μm will also achieve the desired results—reduced burn-in time—of the present invention, but may be cost-prohibitive to achieve, in some instances. Surface roughness may be measured, as known in the art, using, for example, a profilometer, such as those available from KLA-Tencor or Brook-Anco Corporation, the latter under the Thyssen/Hommel brand. Average surface roughness is the arithmetic average of the absolute heights of the profile peaks and valleys, as measured around the centerline about which the surface roughness is measured. For a discussion of surface roughness generally, see *Machinery's Handbook* (Industrial Press, 24rd rev. ed.), pp. 667–674, which is incorporated by reference herein. The smooth or non-knurled induction coil 104, in its preferred embodiment (average surface roughness between about 2 μm and no more than about 30 μm), as described above, has been shown to provide about an eighty percent or more reduction in burn-in time (measured in KwH) in the aforementioned Vectra™ System, as compared to a knurled induction coil, with no observable increase in workpiece contamination. In demonstrations of this burn-in time reduction, the material of the coil has been the same as that of the workpiece. In absolute terms, the burn-in time was reduced to about 2–5 KwH from about 20–25 KwH.

While it is preferred that the entire exterior surface of an induction coil 104, according to the present invention, be of the requisite smoothness, it has been recognized by the inventors that the burn-in process has the most significant effect on the interior surface 128 and, secondarily, on edges 132 and 134. Accordingly, it is preferred that at least interior surface 128 of induction coil 104 be of a smoothness, in accordance with the present invention, and, more preferably, that upper and lower edges 132 and 134 also be so smooth. Ideally, all surfaces of an induction coil should be smooth, in accordance with the present invention, to the extent fabrication costs do not become prohibitive. However, to the extent that coil surfaces facing, residing within, or immediately proximate, the plasma region are smooth, in accordance with the present invention, it is believed that perceptible benefits in burn-in time will be achieved. It will also be recognized, with reference to FIGS. 5 through 9 of the drawings, that any known or otherwise suitable configuration of an internal chamber induction coil may benefit from a smooth surface or surfaces according to the invention.

Having thus described in detail preferred embodiments of the present invention, it is to be understood that the invention defined by the appended claims is not to be limited by particular details set forth in the above description, as many apparent variations thereof are possible without departing from the spirit or scope thereof.

What is claimed is:

1. An inductively coupled ionized sputtering apparatus, comprising:
   a chamber having a grounded wall;
   a target located within said chamber and selectively electrically connected to a DC power source;
   a workpiece pedestal located within said chamber adjacent said target and selectively electrically connected to a DC power source; and
   an RF induction coil located for creating a region of plasma between said target and said workpiece pedestal and selectively electrically connected to an RF power source, wherein at least one surface of said RF induction coil exhibits an average surface roughness of no more than about 30 $\mu$m.

2. The inductively coupled ionized sputtering apparatus of claim 1, wherein said at least one surface of said RF induction coil exhibits an average surface roughness between about 2 $\mu$m and 30 $\mu$m.

3. The inductively coupled ionized sputtering apparatus of claim 1, wherein said RF induction coil has a shape selected from the group of configurations consisting of a single loop, a multiple loop, a variable-pitch multiple loop, a spiral, a variable-pitch spiral, an S-shape, and an annular shape.

4. The inductively coupled ionized sputtering apparatus of claim 1, wherein the target is constructed of a first material, the RF induction coil is constructed of a second material, and said first material is substantially the same composition as said second material.

5. A method of preparing an inductively coupled ionized sputtering apparatus for treating a workpiece, comprising:
   providing a chamber having an electrically grounded wall;
   disposing a target within said chamber;
   electrically connecting said target to a DC power source;
   disposing a workpiece pedestal mounted adjacent said target within said chamber;
   disposing a workpiece on said workpiece pedestal;
   electrically coupling said workpiece pedestal to a DC power source;
   locating an RF induction coil within said chamber substantially between said target and said workpiece, including forming said RF induction coil to exhibit an average surface roughness of no more than about 30 $\mu$m; and
   electrically connecting said RF induction coil to an RF power source.

6. The method of preparing an inductively coupled ionized sputtering apparatus of claim 5, wherein said forming said RF induction coil includes forming said RF induction coil to exhibit an average surface roughness between about 2 $\mu$m and 30 $\mu$m.

7. The method of preparing an inductively coupled ionized sputtering apparatus of claim 5, further including selecting a geometry for said RF induction coil from the group of induction coil geometries consisting of a single loop, a multiple loop, a variable-pitch multiple loop, a spiral, a variable-pitch spiral, an S-shape, and an annular shape.

8. The method of preparing an inductively coupled ionized sputtering apparatus of claim 5, wherein the target is constructed of a first material, the RF induction coil is constructed of a second material, and further including selecting said first material and said second material to be of substantially the same composition.

9. A substantially annular RF induction coil for creating a region of plasma between a workpiece and a target in an inductively coupled ionized sputtering apparatus, wherein said RF induction coil comprises substantially parallel inner and outer substantially annular surfaces, an upper edge between said inner and outer surfaces and a lower edge between said inner and outer surfaces, wherein at least said inner surface exhibits an average surface roughness of no more than about 30 $\mu$m.

10. The substantially annular RF induction coil of claim 9, wherein said upper and lower edges exhibit an average surface roughness of no more than about 30 $\mu$m.

11. The substantially annular RF induction coil of claim 9, wherein at least said substantially parallel inner surface exhibits an average surface roughness between about 2 $\mu$m and 30 $\mu$m.

12. The substantially annular RF induction coil of claim 9, wherein said upper and lower edges exhibit an average surface roughness between about 2 $\mu$m and 30 $\mu$m.

13. An inductively coupled ionized sputtering apparatus, comprising:
   a chamber having a grounded wall;
   a target located within said chamber and selectively electrically connected to a DC power source;
   a workpiece pedestal located within said chamber adjacent said target and selectively electrically connected to a DC power source; and
   an RF induction coil located for creating a region of plasma between said target and said workpiece pedestal and selectively electrically connected to an RF power source;
   wherein said RF induction coil comprises substantially parallel inner and outer substantially annular surfaces, an upper edge between said inner and outer surfaces and a lower edge between said inner and outer surfaces, wherein at least said inner surface exhibits an average surface roughness of no more than about 30 $\mu$m.

14. The apparatus of claim 13, wherein said upper and lower edges exhibit an average surface roughness of no more than about 30 $\mu$m.

15. The apparatus of claim 13, wherein at least said inner surface exhibits an average surface roughness between about 2 $\mu$m and 30 $\mu$m.

16. The apparatus of claim 15, wherein said upper and lower edges exhibit an average surface roughness between about 2 $\mu$m and 30 $\mu$m.

17. The apparatus of claim 13, wherein the target is constructed of a first material, the RF induction coil is constructed of a second material, and said first material is substantially the same composition as said second material.

18. A method of preparing an inductively coupled ionized sputtering apparatus for use in treating a workpiece, comprising:
   providing a chamber having an electrically grounded wall;
   disposing a target within said chamber;
   electrically coupling said target to a DC power source;
   disposing a workpiece pedestal mounted adjacent said target within said chamber;
   disposing a workpiece on said workpiece pedestal;

electrically coupling said workpiece to a DC power source through said workpiece pedestal;

locating an RF induction coil within said chamber substantially between said target and said workpiece, including forming said RF induction coil in a substantially annular shape including substantially parallel inner and outer surfaces and upper and lower edges extending between said inner and outer surfaces, so that at least said inner surface exhibits an average surface roughness of no more than about 30 μm; and electrically connecting said RF induction coil to an RF power source.

19. The method of preparing an inductively coupled ionized sputtering apparatus of claim 18, wherein said forming said RF induction coil includes forming said RF induction coil so that said upper and lower edges exhibit an average surface roughness of no more than about 30 μm.

20. The method of preparing an inductively coupled ionized sputtering apparatus of claim 18, wherein said forming said RF induction coil includes forming said RF induction coil so that at least said inner surface exhibits an average surface roughness between about 2 μm and 30 μm.

21. The method of preparing an inductively coupled ionized sputtering apparatus of claim 20, wherein said forming said RF induction coil includes forming said, RF induction coil so that said upper and lower edges exhibit an average surface roughness between about 2 μm and 30 μm.

22. The method of preparing an inductively coupled ionized sputtering apparatus of claim 18, wherein the target is constructed of a first material, the RF induction coil is constructed of a second material, and further including selecting said first material and said second material to be of substantially the same composition.

23. An RF induction coil for creating a region of plasma between a workpiece and a target in an inductively coupled ionized sputtering apparatus, wherein said RF induction coil is configured to comprise a plurality of surfaces and for mounting within said inductively coupled ionized sputtering apparatus in a location and orientation wherein at least one of said plurlity of surfaces exhibits an average surface roughness of no more than about 30 μm and faces, or substantially resides within, a plasma field during operation of said apparatus.

24. The RF induction coil of claim 23 wherein said at least one of said plurality of surfaces exhibits an average surface roughness between about 2 μm and 30 μm.

25. An inductively coupled ionized sputtering apparatus, comprising:

a chamber having a grounded wall;

a target located within said chamber and selectively electrically connected to a DC power source;

a workpiece pedestal located within said chamber adjacent said target and selectively electrically connected to a DC power source; and an RF induction coil for creating a region of plasma between said target and said workpiece pedestal selectively electrically connected to an RF power source;

wherein said RF induction coil comprises a plurality of surfaces and said RF induction coil is located within said chamber with at least some of said surfaces located and oriented so as to be facing, or substantially residing within, a plasma field during operation of said apparatus, and wherein at least some of said located and oriented surfaces exhibit an average surface roughness of no more than about 30 μm.

26. The apparatus of claim 25, wherein said at least some of said located and oriented surfaces exhibit an average surface roughness between about 2 μm and 30 μm.

27. The apparatus of claim 25, wherein the target is constructed of a first material, the RF induction coil is constructed of a second material, and said first material is substantially the same composition as said second material.

28. A method of preparing an inductively coupled ionized sputtering apparatus for treating a workpiece, comprising:

providing a chamber having an electrically grounded wall;

disposing a target within said chamber;

electrically coupling said target to a DC power source;

disposing a workpiece pedestal mounted adjacent said target within said chamber;

disposing a workpiece on said workpiece pedestal;

electrically coupling said workpiece to a DC power source through said workpiece pedestal;

locating an RF induction coil within said chamber substantially between said target and said workpiece, including forming said RF induction coil to comprise a plurality of surfaces, at least one of said surfaces exhibiting an average surface roughness of no more than about 30 μm;

disposing said RF induction coil within said chamber above said target with said at least one of said plurality of surfaces located and oriented so as to face or substantially reside within a location of a plasma field to be generated within said chamber; and electrically connecting said RF induction coil to an RF power source.

29. The method of preparing an inductively coupled ionized sputtering apparatus of claim 28, wherein said forming said RF induction coil includes forming said RF induction coil to have said at least one of said surfaces exhibit an average surface roughness between about 2 μm and 30 μm.

30. The method of preparing an inductively coupled ionized sputtering apparatus of claim 28, wherein the target is constructed of a first material, the RF induction coil is constructed of a second material, and further including selecting said first material and said second material to be of substantially the same composition.

\* \* \* \* \*

UNITED STATES PATENT AND TRADEMARK OFFICE
CERTIFICATE OF CORRECTION

PATENT NO. : 6,168,696 B1 Page 1 of 1
DATED : January 2, 2001
INVENTOR(S) : Randle D. Burton, Scott G. Meikle and James A. Schindel It is certified that error appears in the above-identified patent and that said Letters Patent is hereby corrected as shown below:

Column 1,
Line 10, delete the comma after "(PVD)"

Column 9,
Line 25, change "said, RF" to -- said RF --
Line 40, change "plurlity" to -- plurality --

Signed and Sealed this

Twenty-fifth Day of January, 2005

JON W. DUDAS
*Director of the United States Patent and Trademark Office*